United States Patent [19]
Good et al.

[11] Patent Number: 5,450,042
[45] Date of Patent: Sep. 12, 1995

[54] LOW DISTORTION CRYSTAL OSCILLATOR CIRCUIT

[75] Inventors: Brian K. Good, Greentown; Seyed R. Zarabadi, Kokomo, both of Ind.

[73] Assignee: Delco Electronics Corporation, Kokomo, Ind.

[21] Appl. No.: 257,259

[22] Filed: Jun. 8, 1994

[51] Int. Cl.$^6$ .............................................. H03B 5/36
[52] U.S. Cl. ......................... 331/117 FE; 331/116 FE
[58] Field of Search .............. 331/116 FE, 117 FE, 331/107 R, 108 R, 158, 116 R, 117 R, 167, 108 D; 327/566, 581

[56] References Cited

U.S. PATENT DOCUMENTS

| | | | |
|---|---|---|---|
| 3,889,211 | 6/1975 | Morozumi | 331/116 R |
| 4,912,435 | 3/1990 | Williams et al. | 331/75 |

OTHER PUBLICATIONS

A. B. Grebene, Bipolar MOS Analog Integrated Circuit Design, Wiley–Interscience, pp. 551–555 (1984).

*Primary Examiner*—Robert J. Pascal
*Assistant Examiner*—David H. Vu
*Attorney, Agent, or Firm*—Jimmy L. Funke

[57] ABSTRACT

A crystal oscillator circuit that provides a low distortion clocking signal. The oscillator circuit incorporates an inverter circuit in combination with a diode connected transmission gate circuit. The transmission gate circuit includes two MOSFETs connected between input and output nodes of the inverter circuit. When the current at the input node goes high and the current at the output node goes low, one of the two transmission gate circuit MOSFETs will begin conducting such that current at the input node will be transferred to the output node, thus decreasing the voltage difference between the two nodes. Likewise, when the current at the output node goes high and the current at the input node goes low, the other MOSFET of the transmission gate circuit will begin to conduct such that current is transferred from the output node to the input node, again reducing the voltage difference between the input and output node. Additionally, the transmission gate circuit provides the impedance necessary to generate oscillation of the oscillator circuit at start-up to regulate the output voltage swing of the oscillator circuit.

17 Claims, 1 Drawing Sheet

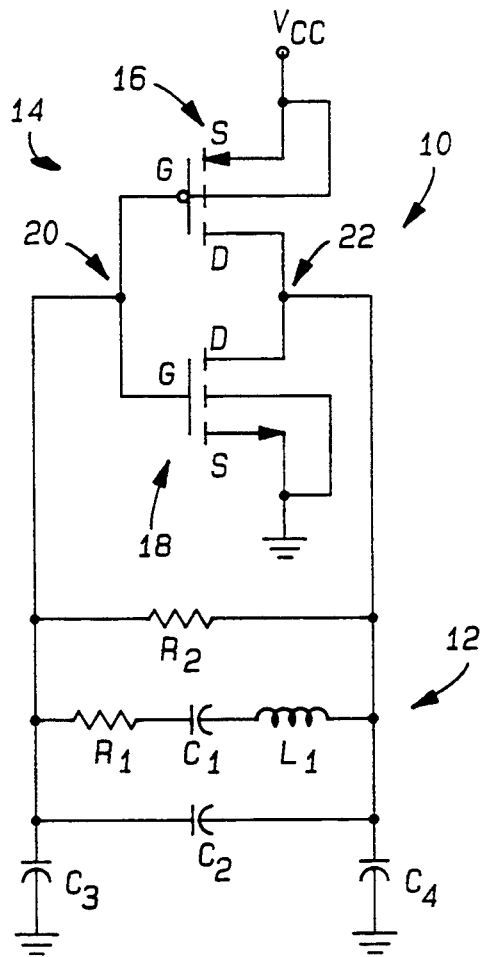
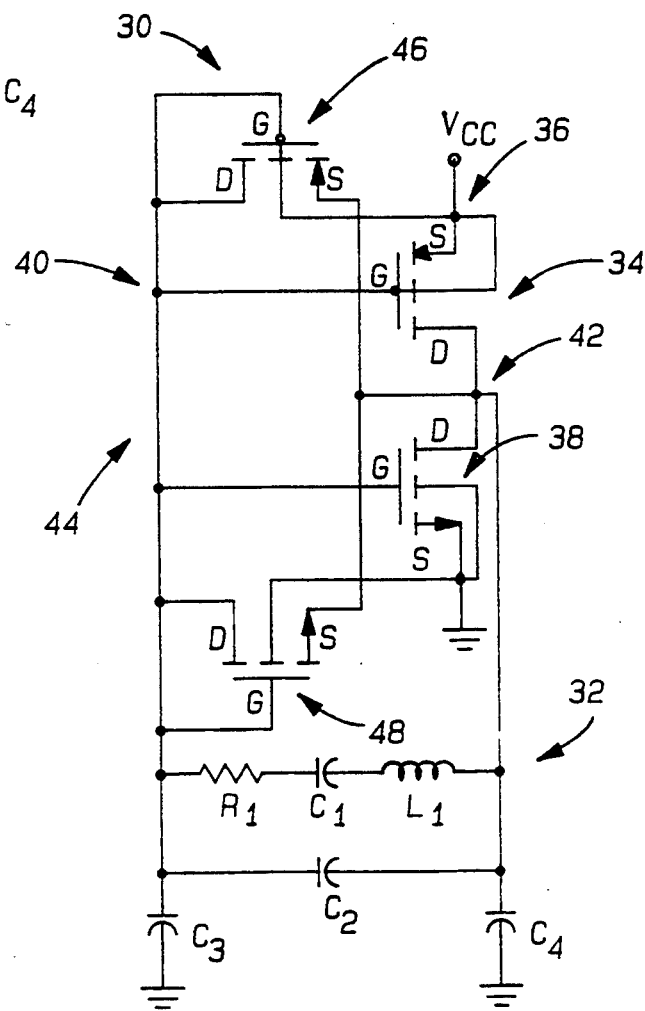
Fig-1
PRIOR ART
Fig-2

LOW DISTORTION CRYSTAL OSCILLATOR CIRCUIT

BACKGROUND OF THE INVENTION

1. Field of the Invention

This invention relates generally to a low distortion crystal oscillator and, more particularly, to a crystal oscillator that provides smooth transitions between highs and lows in the output signal of the oscillator so as to eliminate harmonic distortion caused by sharp transitions.

2. Discussion of the Related Art

Most circuits that use digital logic require a clock circuit in order to generate a clocking signal from which the digital logic elements can be controlled. Typically, the clock circuit will include a crystal oscillator having some type of piezoelectric device, such as a quartz crystal or a crystal resonator, in order to generate an oscillation frequency. For most digital logic circuits, the oscillator circuit is generally an integrated circuit that takes advantage of complimentary metal oxide semi-conductor (CMOS) technology. Known crystal oscillators produce square wave output clocking signals having sharp transitions between "highs" and "lows" of the wave. An oscillator of this type is discussed in A. B. Grebene, "Bipolar MOS Analog Integrated Circuit Design," Wiley-Interscience, 1984, pp. 551–555.

FIG. 1 shows a prior art schematic diagram of an oscillator circuit 10 of the type discussed above which can be used to generate a clocking signal. The oscillator circuit 10 includes an equivalent circuit of a piezoelectric resonator, such as a quartz crystal or crystal resonator, represented generally at 12. The resonator circuit 12 is an RCL circuit including a resistor $R_1$, capacitors $C_1$ and $C_2$, and an inductor $L_1$. An equivalent circuit representation of a crystal oscillator as depicted by the circuit 12 is well known in the art. For a typical crystal resonator having a resonant frequency of 12 MHz, $R_1$ would be about 5.5 ohms, $C_1$ would be about 5.1 picofarads (pF), $C_2$ would be about 34.4 pF, and $L_1$ would be about 37.5 microHenries ($\mu$H). Capacitors $C_3$ and $C_4$ are load capacitors which help generate and sustain the oscillation of the resonator circuit 12 as is well understood in the art. For the above resonant frequency of 12 MHz, the load capacitors $C_3$ and $C_4$ would have a value of approximately 30 pF.

The oscillator circuit 10 also includes an inverter circuit 14. The inverter circuit 14 includes a P-channel metal oxide semiconductor field effect transistor (MOSFET) 16 and an N-channel MOSFET 18. Each of the FETs 16 and 18 include a source terminal, a gate terminal, and a drain terminal, labelled S, G and D, respectively. Additionally, for each of the FETs 16 and 18, a substrate terminal is shown connected to its source terminal. As is apparent by reviewing the inverter circuit 14, the source terminal of the FET 16 is connected to an input voltage $V_{cc}$ and the source terminal of the FET 18 connected to ground. Additionally, the gate terminals of the FETs 16 and 18 are connected together and the drain terminals of the FETs 16 and 18 are connected together. The connection point between the gate terminals of the FETs 16 and 18 is an input node 20, and the connection point between the drain terminals of the FETs 16 and 18 is an output node 22 of the inverter circuit 14. As is apparent from FIG. 1, the output node 22 is electrically connected to an input side of the resonator circuit 12, and the input node 20 is electrically connected to an output side of the resonator circuit 12. An output clocking signal from the oscillator circuit 10 is taken from the node 22 and is subsequently applied to digital logic circuitry (not shown) in a manner that is well understood in the art.

The purpose of the inverter circuit 14 is to provide a loop gain that is greater than one in order to initiate and sustain oscillations of the resonator circuit 12. Ideally, the gain of the inverter circuit 14 need only be greater than unity at the resonant frequency. However, due to process and temperature variations, the gain of the inverter circuit 14 is generally set within the range of about 15–20 db in order to guarantee a sustained, stable oscillation. High gains, however, tend to drive up the size of the inverter circuit 14.

A low signal at the node 20 causes the FET 16 to conduct such that current from the voltage source $V_{cc}$ is applied to the node 22 which in turn causes the resonator circuit 12 to be energized as capacitor $C_4$ is charged. During a stable, sustained oscillation, the node 20 will then go high which causes the FET 18 to start conducting such that the node 22 will be forced toward ground, and the FET 16 to stop conducting. This will then drive the node 22 low. The nodes 20 and 22 oscillate in this manner in tune with the resonant frequency of the resonator circuit 12. The inverter circuit 14 provides a 180° phase shift and the impedance of the crystal resonator along with the load capacitors $C_3$ and $C_4$ provide another 180° phase shift at the resonant frequency of the resonant circuit 12 such that the resonant circuit 12 can maintain the sustained oscillation. The output signal at the node 22 is distorted clocking signal having sharp transitions between $V_{cc}$ and ground.

One drawback with the above-described oscillator circuit 10 is that there are sharp transitions between a high $V_{cc}$ signal and a low ground signal at the output node 22. These sharp transitions as a result of the FETs 16 and 18 become conductive and nonconductive produce high distortion from high level harmonics. These high level harmonics are a major source of emitted noise, such as radio frequency interference (RFI) and electromagnetic interference (EMI). This emitted noise can cause interference and failure in electronic systems.

A feedback resistor $R_2$ is provided between the nodes 20 and 22 in order to provide the necessary impedance and phase shift in the circuit 12 to force the inverter circuit 14 to change states. The purpose of the resistor $R_2$ is to put the inverter circuit 14 in a high gain position at start-up where the input node 20 and the output node 22 are at substantially the same potential, and both the FETs 16 and 18 are in their saturation regions such that they are conducting. In order to provide this function, the value of the resistor $R_2$ is set depending on the resonant frequency of the circuit 12. For lower frequency crystals, $R_2$ is generally greater than 1 megaohm, and for higher frequency crystals, i.e., greater than 1 MHz, the value of $R_2$ is generally between 500 kohms and 1 megaohm. Once the resonator circuit 12 is oscillating, the resistor $R_2$ is not needed, but its presence provides some noise immunity to external noise sources received by the circuit 10.

The start-up time at which the quartz crystal or crystal resonator maintains a sustained oscillation is controlled by two factors. First, the resonator circuit 12 sets the Q of the oscillator circuit 10. The start-up time is proportion to the Q value. This factor is, however, fixed for any given crystal and has little variation. The second factor is a combination of the output impedance of the inverter circuit 14, the feedback resistor $R_2$, the load capacitors $C_3$ and $C_4$ and the case capacitance of the crystal. These factors combine to create an RC time constant that directly effects the start-up time. The case capacitance is fixed for a given crystal and the load capacitance cannot be changed without affecting the frequency of oscillation. The start-up time can be minimized by reducing the value of the feedback resistor $R_2$ or the output impedance of the inverter circuit 14. Reducing the value of the feedback resistor $R_2$ increases the losses of the inverter circuit 14, and thus, there is limitations on how low the value of the resistor $R_2$ can be. Reducing $R_2$ also increases the phase noise of the overall oscillator circuit 10. The output impedance of the inverter circuit 14 can be reduced by making the FETs 16 and 18 larger, but as the size of the inverter circuit 14 is increased, the increase in the gate capacitance of the inverter circuit 14 will overshadow the effects of the lower output impedance, and the start-up time will begin to increase rather than decrease. Therefore, for typical applications, the size of the inverter circuit 14 is generally large, and thus the gain of the inverter circuit 14 is high.

What is needed is an oscillator circuit that provides quick start-up, is reduced in size, and does not emit substantial interfering noise. It is therefore an object of the present invention to provide such an oscillator circuit for producing a clocking signal.

SUMMARY OF THE INVENTION

In accordance with the teaching of the present invention, an oscillator circuit is disclosed that produces a clocking signal having low distortion. The oscillator circuit incorporates an inverter circuit in combination with a diode connected transmission gate circuit. The transmission gate circuit includes two MOSFETs connected between input and output nodes of the inverter circuit. When the current at the input node is going high and the circuit at the output node is going low, one of the two transmission gate circuit MOSFETs will begin conducting such that current at the input node will be transferred to the output node, thus decreasing the voltage difference between the two nodes. Likewise, when the current at the output node goes high and the current at the input node goes low, the other MOSFET of the transmission gate circuit will begin to conduct such that current is transferred from the output node to the input node, again reducing the voltage difference between the input and output nodes. Consequently, the clocking signal at the output of the oscillator circuit is a signal having smooth transitions between highs and lows of the clocking signal so as to reduce sharp transitions this signal and thus interfering noise.

Additionally, the transmission gate circuit provides the impedance necessary to generate oscillation of the oscillator circuit at start-up. When the inverter circuit is conducting at start-up of the oscillator circuit, the MOSFETs associated with the transmission gate circuit will be off, and thus will look like high impedance devices. Therefore, the feedback necessary to allow the inverter circuit to invert will be provided by these MOSFETs. Further, because the drive current of the inverter circuit can be reduced because of reduced losses, the size of the circuit can be reduced.

Additional objects, advantages, and features of the present invention will become apparent from the following description and appended claims, taken in conjunction with the accompanying drawings.

BRIEF DESCRIPTION OF THE DRAWINGS

FIG. 1 is a schematic view of a prior art oscillator circuit; and

FIG. 2 is a schematic view of an oscillator circuit according to a preferred embodiment of the present invention.

DETAILED DESCRIPTION OF THE PREFERRED EMBODIMENTS

The following discussion of the preferred embodiments concerning an oscillator circuit for producing a clocking signal is merely exemplary in nature and is in no way intended to limit the invention or its applications or uses.

FIG. 2 shows a schematic diagram of an oscillator circuit 30 according to a preferred embodiment of the present invention. The oscillator circuit 30 includes a crystal resonator represented as an equivalent RCL resonator circuit 32 including a resistor $R_1$, capacitors $C_1$ and $C_2$, and an inductor $L_1$ having the same characteristics and performance as the resonator circuit 12 of FIG. 1. Additionally, the oscillator circuit 30 includes load capacitors $C_3$ and $C_4$ which function in the same manner as the load capacitor $C_3$ and $C_4$ of the oscillator circuit 10 of FIG. 1. Further, the oscillator circuit 30 includes an inverter circuit 34 having a P-channel MOSFET 36 and an N-channel MOSFET 38 both having a source terminal, a gate terminal, and a drain terminal labelled accordingly. The source terminals, gate terminals and drain terminals of the FETs 36 and 38 are connected in the same manner as the terminals of the FETs 16 and 18 of the inverter circuit 14 of FIG. 1, above, such that an input node 40 and an output node 42 are provided. Consequently, the function of each of the circuit elements of the resonator circuit 32 and the inverter circuit 34 are well known in the art. An output clocking signal is taken from the output node 42.

The oscillator circuit 30 includes a diode connected transmission gate circuit 44. The transmission gate circuit 44 includes a P-channel MOSFET 46 and an N-channel MOSFET 48, each having a source terminal, a gate terminal and a drain terminal, labelled accordingly. As is apparent by reviewing FIG. 2, the gate and drain terminals of the FETs 46 and 48 are electrically connected to the input node 40, and the source terminals of the FETs 46 and 48 are electrically connected to the output node 42. As will be discussed below, the gate circuit 44 limits the voltage swing of the inverter circuit 34 such that the high value of the output clocking signal is less than $V_{cc}$ and the low value of the output clocking signal is greater than ground potential. Further, the transitions between the high and low voltage potentials are smooth such that the output signal represents a sine wave instead of a square wave.

When the oscillator circuit 30 is operating in a stable manner having a sustained oscillation, and the input node 40 goes high, the FET 38 begins to conduct such that the output node 42 is connected to ground, and thus goes to a low potential. Further, when the input node 40 goes high, the FET 48 begins to conduct such that current at the input node 40 travels through the FET 48 and is applied to the output node 42. When the FET 48 is conductive, the current at the input node 40 will be higher than the current at the output node 42, but the current at the input node 40 and the output node 42 will be drawn together so as to reduce the difference between them. When the input node 40 goes low, the FET 36 begins to conduct such that the output node 42 is connected to the voltage source $V_{cc}$ and current is applied to the output node 42. Additionally, when the input node 40 goes low, the FET 48 stops conducting and the FET 46 begins to conduct such that current at the output node 42 travels through the FET 46 and is applied to the input node 40. When the FET 46 is conductive, current at the output node 42 will be higher than the current at the input node 40, but current at the output node 42 and the input node 40 will be drawn together so as to reduce the difference between them. The farther the voltage at the input node 40 and output node 42 are apart, the more either the FET 46 or the FET 48 will conduct, thus increasing the rate at which the two nodes are drawn together. As the oscillation continues, the current differences between the input node 40 and the output node 42 will be reduced and the transition between highs and lows will be smoother.

The FETs 46 and 48 also provide the impedance necessary to provide fast start-up of the oscillator circuit 30. Therefore, the feedback resistor $R_2$ of the oscillator circuit 10 can be eliminated. At start-up, the voltage at the input node 40 and the output node 42 will be substantially equal, and the gain of the inverter circuit 34 will be high. At this time, both of the FETs 46 and 48 will be off and the FETs 36 and 38 will be conducting the same current. During this occurrence, the FETs 46 and 48 will look like high impedance devices, thus providing the feedback impedance necessary to allow the inverter circuit 34 to invert and a current change in the resonator circuit 32 to be generated. It is noted that the equivalent impedance presented by the FETs 46 and 48 will be less than would be necessary with the resistor $R_2$. The reason that the oscillator circuit 30 can operate with a lower feedback impedance is due to the impedance matching of the feedback to the inverter circuit 34.

The impedance matching between the gate circuit 44 and the inverter circuit 34 allows the size of the inverter circuit 34 to be reduced. This is possible because the impedance of the FETs 46 and 48 of the transmission gate circuit 44 will vary with process, temperature and supply, along with the inverter circuit 34, and thus, will maintain the optimum linearization of the transfer and gain characteristics of the inverter circuit 34 for a sustained oscillation over these variations. In a typical application (12-16 MHz), the width of the FET 16 would be about 480 microns and the length of the FET 16 would be about 1.6 microns to provide enough current drive to overcome the losses. The width of the FET 18 would be about 160 microns and the length of the FET 18 would be about 1.6 microns. The design of the oscillator circuit 30 would be such that the FETs 36 and 46 could have a width of about 32 microns and length of 2 microns, and the FETs 38 and 48 could have a length of 21 microns and a width of 2 microns.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

We claim:

1. An oscillator circuit for providing an oscillating output signal, said oscillator circuit comprising:
    a resonator, said resonator providing a resonant frequency signal upon receiving an inverting signal;
    an inverter circuit, said inverter circuit applying the inverting signal to the resonator; and
    a transmission gate circuit, said transmission gate circuit including gate means for applying current from an input node of the inverter circuit to an output node of the inverter circuit when the input node is at a higher current than the output node, and applying current from the output node to the input node when the output node is at a higher current than the input node;
    wherein the transmission gate circuit includes a first FET and a second FET, each of the first and second FETS including a drain terminal, a gate terminal, and a source terminal; wherein the drain terminals and the gate terminals of the first and second FETs are electrically connected to the input node, and the source terminals of the first and second FETs are electrically connected to the output node.

2. The oscillator circuit according to claim 1 wherein the first FET is a p-channel MOSFET, said first FET allowing current to flow from the output node to the input node, and wherein the second FET is an n-channel MOSFET, said second FET allowing current to flow from the input node to the output node.

3. An oscillator circuit according to claim 1 wherein the inverter circuit includes a first FET and a second FET, each of the first and second FETs including a source terminal, a gate terminal, and a drain terminal, wherein the gate terminals of the first and second FETs are connected to the input node, and the drain terminals of the first and second FETs are connected to the output node.

4. The oscillator circuit according to claim 3 wherein the source terminal of the first FET is connected to a voltage source, and the source terminal of the second FET is connected to a ground potential.

5. The oscillator circuit according to claim 4 wherein the first FET is a p-channel MOSFET and the second FET is an n-channel MOSFET.

6. The oscillator circuit according to claim 1 wherein the resonator is a crystal resonator having an input and an output, wherein the input of the crystal resonator is electrically connected to the output node and the output of the crystal resonator is electrically connected to the input node.

7. The oscillator circuit according to claim 1 wherein the transmission gate circuit acts like a voltage swing variable feedback impedance device so as to enable the resonator to resonate at start-up of the oscillator circuit.

8. An oscillator circuit for providing an oscillating output signal, said oscillator circuit comprising:
    a crystal resonator, said crystal resonator providing a resonant frequency signal upon receiving an inverting signal;
    an inverter circuit including a first FET and a second FET, each of the first and second FETs including a source terminal, a gate terminal and a drain terminal, wherein the gate terminals of the first and second FETs are connected to an input node of the inverter circuit, the drain terminals of the first and second FETs are connected to an output node of the inverter circuit, the source terminal of the first FET is connected to a voltage source, and the source terminal of the second FET is connected to ground, said inverter circuit applying the inverting signal to the resonator; and a transmission gate circuit including a third FET and a fourth FET, each of the third and fourth FETs including a source terminal, a gate terminal and a drain terminal, wherein the gate and drain terminals of the third and fourth FETs are connected to the input node and the source terminals of the third and fourth FETs are connected to the output node, and wherein when the input node goes high and the output node goes low, the fourth FET allows current to flow from the input node to the output node, and when the input node goes low and the output node goes high, the third FET allows current to flow from the output node to the input node so as to reduce the voltage differences between the input and output node and provide an output signal having smooth transitions.

9. The oscillator circuit according to claim 8 wherein the first and third FETs are p-channel MOSFETs, said third FET allowing current to flow from the output node to the input node, and wherein the second and fourth FETs are n-channel MOSFETs, said fourth FET allowing current to flow from the input node to the output node.

10. The oscillator circuit according to claim 8 wherein the resonator includes an input and an output, wherein the input of the resonator is electrically connected to the output node and the output of the resonator is electrically connected to the input node.

11. The oscillator circuit according to claim 8 wherein the transmission gate circuit acts like a voltage swing variable feedback impedance device so as to enable the resonator to resonate at start-up of the oscillator circuit and regulate the voltage swing of the output signal.

12. A method of generating a clocking signal, said method comprising the steps of:

providing a resonator, said resonator generating a resonant frequency signal upon receiving an inverting signal;

providing an inverter circuit, said inverter circuit applying the inverting signal to the resonator; and providing a transmission gate circuit, said transmission gate circuit applying current from an input node of the inverter circuit to an output node of the inverter circuit when the input node is at a higher voltage than the output node, and applying voltage from the output node to the input node when the output node is at a higher current than the input node;

wherein the step of providing a transmission gate circuit includes providing a first FET and a second FET, each of the first and second FETs including a drain terminal, a gate terminal and a source terminal, wherein the drain terminals and the gate terminals of the first and second FETs are electrically connected to the input node, and source terminals of the first and second FETs are electrically connected to the output node.

13. The method according to claim 12 wherein the first FET is a p-channel MOSFET, said first FET allowing current to flow from the output node to the input node, and wherein the second FET is an n-channel MOSFET, said second FET allowing current to flow from the input node to the output node.

14. The method according to claim 12 wherein the step of providing an inverter circuit includes providing a first FET and a second FET, each of the first and second FETs including a source terminal, a gate terminal and a drain terminal, wherein the gate terminals of the first and second FETs are connected to the input node and the drain terminals of the first and second FETs are connected to the output node.

15. The method according to claim 14 wherein the source terminal of the first FET is connected to a voltage source, and the source of the second FET is connected to a ground potential.

16. The method according to claim 15 wherein the first FET is a p-channel MOSFET and the second FET is an n-channel MOSFET.

17. The method according to claim 12 wherein the step of providing a transmission gate circuit includes providing a transmission gate circuit that acts like a feedback impedance device so as to enable the resonator to resonate at start-up of the oscillator circuit and regulate the output voltage swing of the oscillator circuit.

* * * * *